United States Patent [19]

Balachandran

[11] Patent Number: 5,409,887
[45] Date of Patent: Apr. 25, 1995

[54] ENHANCEMENT OF MECHANICAL PROPERTIES OF 123 SUPERCONDUCTORS

[75] Inventor: Uthamalingam Balachandran, Hinsdale, Ill.

[73] Assignee: The University of Chicago, Chicago, Ill.

[21] Appl. No.: 23,224

[22] Filed: Feb. 25, 1993

[51] Int. Cl.$^6$ .................. H01F 6/00; C04B 35/505
[52] U.S. Cl. ......................... 505/490; 501/123; 501/152; 264/65; 505/500; 505/785; 505/126
[58] Field of Search ............ 505/1, 733, 785, 729, 505/490, 500; 501/123, 152; 264/65

[56] References Cited

U.S. PATENT DOCUMENTS 5,240,903  8/1993  Shimoyama et al. .................. 505/1

OTHER PUBLICATIONS

Paulose et al. "$YBa_2SnO_{5.5}$: A New Phase in $YBa_2Ca_3O_7$-$SnO_2$ System" *Jap. J. Appl. Phys.*, vol. 31, part 1, 5A, pp. 1323–1325, May 1992.

Primary Examiner—Mark L. Bell
Assistant Examiner—C. Bonner
Attorney, Agent, or Firm—Reinhart, Boerner, Van Deuren, Norris & Rieselbach

[57] ABSTRACT

A composition and method of preparing $YBa_2Cu_3O_{7-x}$ superconductor. Addition of tin oxide containing compounds to YBCO superconductors results in substantial improvement of fracture toughness and other mechanical properties without affect on $T_c$. About 5–20% additions give rise to substantially improved mechanical properties.

1 Claim, No Drawings

ENHANCEMENT OF MECHANICAL PROPERTIES OF 123 SUPERCONDUCTORS

This invention was conceived under Contract No. W-31-109-ENG-38 between the US. Department of Energy and the University of Chicago. The U.S. Government retains certain rights in this invention pursuant to this Contract.

The present invention is concerned generally with a method of enhancing the mechanical properties of 123, or YBCO ($YBa_2 Cu_3O_{7-x}$), high temperature superconductors. More particularly, the invention is concerned with a method of making YBCO superconductors having enhanced mechanical properties by virtue of additions of $SnO_2$ and $BaSnO_3$ in specific amounts.

While the new high temperature ceramic superconductors exhibit remarkable electrical properties, their practical commercial use requires substantial improvement of the mechanical properties, such as fracture toughness. The mechanical fracture toughness can be enhanced for ceramics by conventional mechanisms such as promotion of a tortuous crack path, but such a technique leads to only modest improvement of properties. The method of microcrack toughening can be quite effective but in YBCO superconductors the electrical properties are drastically reduced.

Other prior art methods have tried to use oxide deposits, including $Ag_2O$ and $ZrO_2$. In the case of $Ag_2O$ one cannot form melt grown ("MG") or quench melt grown ("QMG") superconductors because the growth temperature would cause melting of the $Ag_2O$ phase. Such a liquid phase would not allow hardening of the superconductor but rather would merely melt and fill the interstices between the superconducting ceramic phase. In the case of $ZrO_2$, it has been found that a passivating layer must be used to coat the $ZrO_2$; or the $ZrO_2$ reacts with the superconducting ceramic which undergoes phase degradation and causes associated loss of superconducting properties.

It is therefore an object of the invention to provide an improved method of manufacture and composition of matter of YBCO superconductor.

It is another object of the invention to provide a novel composition of YBCO superconductor having enhanced mechanical properties.

It is a further object of the invention to provide an improved YBCO superconductor with $SnO_2$ and/or $BaSnO_3$ additives.

It is yet another object of the invention to provide a novel composition of YBCO superconductor with small quantities of $SnO_2$ and $BaSnO_3$ additions.

It is still another object of the invention to provide an improved method of manufacture of YBCO superconductor having nonmeltable additives processable by MG or QMG techniques.

These and other objects and advantages will be described in the Detailed Description provided hereinbelow.

DETAILED DESCRIPTION OF PREFERRED EMBODIMENTS

In accordance with one form of the invention, a melt grown ("MG") bulk YBCO superconductor was prepared including additives of $BaSnO_3$. In another aspect of the invention $SnO_2$ was added to YBCO superconductors which were prepared by sintering at high temperatures. These two additives were preferably included in the starting materials for preparing the end product superconductor with the growth techniques recited hereinbefore. A range of percentages of additives were used, and for the $SnO_2$ additive substantial improvements in mechanical toughness were obtained as shown in Table I.

TABLE I

Measured Properties for Various Levels of $SnO_2$ Additions

| | Toughness MPa/m | Strength MPa | Modulus GPa | Hardness Kg/mm$^2$ |
|---|---|---|---|---|
| 123 (no additive) | 1.49 | 27 | 39.3 | 725 |
| with 5% | 2.82 | 79 | 103 | 1241 |
| with 10% | 2.85 | 80 | 105 | 4358 |
| 20% | 3.07 | 88 | 67.4 | 2060 |
| 30% | 1.64 | 30 | 56.2 | 1441 |

The above detailed results were obtained with virtually no deleterious changes in the superconducting transition temperatures $T_c$ of 90° K.

Similar results were obtained for the use of $BaSnO_3$ additions in melt grown YBCO, and the results are shown in Table II below. Based on the observed behavior of $SnO_2$ and $BaSnO_3$, it is expected that for purposes of enhancing mechanical properties of YBCO superconductors, $BaSnO_3$ additions behave substantially the same as $SnO_2$ additions. For example, MG or QMG processes will not cause melting of the tin oxide material.

TABLE II

| Toughness (MPa/m) | |
|---|---|
| 123 | 0.74 ± 0.23* |
| With 6% $BaSnO_3$ | 1.9–2.9 |

*Average of ten measurements

EXAMPLES

The following nonlimiting examples illustrate methods of preparation and testing of the inventive compositions.

EXAMPLE I

Preparation of YBCO(123) Superconductor Powder 181.56 gm of $Y_2O_3$ (yttrium oxide), 634.68 gm of $BaCO_3$ (barium carbonate) and 383.75 gm of CuO (copper oxide) were wet milled (mixed) for 15 hours in methanol in polyethylene jars containing $ZrO_2$ (zirconia) grinding media. The resultant slurry was pan dried and screened through a 30-mesh sieve. The screened powder was calcined for 8 hours in flowing oxygen with a pressure of 3 mm Hg (mercury) at a temperature of 850° C. At the end of 8 hours (at 850° C.), the vacuum was discontinued and ambient-pressure oxygen gas was passed over the material and temperature increased to 900 C. The powders were held at 900° C. for 12 hours and cooled. A 10-hour hold at 450° C. was incorporated into the cooling schedule to promote oxygenation of the resulting powder. The resultant powder was ground in an agate mortar and pestle. The powders were characterized using X-ray diffraction and differential thermal analysis (DTA). The mean particle size was measured to be ≈4 micron.

EXAMPLE II

Mixing with $SnO_2$ (tin oxide) Powder with 123

Samples made are:
Pure 123

123+5 volume % $SnO_2$
123+10 Volume % $SnO_2$
123+20 volume % $SnO_2$
123+30 Volume % $SnO_2$ Ten volume % corresponds to 10.8 Wt. % of $SnO_2$. For 10 vol % $SnO_2$ mixture (composite), we took 89.2 gram of 123 powder and mixed with 10.8 gram of $SnO_2$. The mixture was wet milled in methanol (with zirconia milling media) for 15 hours. The slurry was pan dried and gently crushed in an agate mortar & pestle. The same procedure is used to make 5%, 20% and 30% $SnO_2$ added composite.

Pure 123 powder synthesized in Example I was the control for property comparison.

EXAMPLE III

Preparation of Bar Samples for Mechanical Property Measurement

The 123 and 123 with $SnO_2$ were compacted into rectangular bars (1.75" long×0.312" wide×0.15" thick) using a rectangular die. The compaction pressure used was 27,500 psi.

Mechanical Testing: All the bars were polished with methanol to make surface smooth. The fracture toughness, elastic modulus, and strength, were measured in Instron Machine. Four point bend test was used. The hardness was measured using a micro hardness indentation technique.

EXAMPLE IV

Sintering of the Bar Samples

Each composition was sintered at various temperatures in order to obtain the same density (for mechanical property measurement). For pure 123: Bars were sintered at 970° C. in oxygen gas atmosphere for 10 hours followed by annealing at 450° C. for 10 hours.

For 123+5% $SnO_2$: 970° C. for 10 hours was followed by annealing at 450° C. for 10 hours.

For 123+10% $SnO_2$: same as for the 5% $SnO_2$ samples.

For 123+20% $SnO_2$: 980° C. for 10 hours followed by 450° C. for 10 hours.

For 123+30% $SnO_2$: 1075° C. for 10 hours followed by 450° C. for 10 hours. The density of samples in all cases were: 5.68–5.75 g/cc.

While preferred embodiments of the invention have been shown and described, it will be clear to those of skill in the art that various changes and modifications can be made without departing from the invention in its broader aspects as set forth in the claims.

What is claimed is:

1. A method of producing a mixture of $YBa_2Cu_3O_{7-x}$ superconductor and a $SnO_2$ phase having improved fracture toughness, comprising the steps of:

providing starting materials for making said $YBa_2Cu_3O_{7-x}$ superconductor;

heating said starting materials to form a powder consisting essentially of said $YBa_2Cu_3O_{7-x}$ superconductor;

adding to said powdered $YBa_2Cu_3O_{7-x}$ a powder consisting essentially of $SnO_2$ to form a powdered mixture of said $YBa_2Cu_3O_{7-x}$ and $SnO_2$ particles in the range of at least 5% up to a maximum of 20% by volume;

pressing said powdered mixture to form a solid mass;

sintering said solid mass using a step consisting of heating at a temperature of at least 970° C. in an oxygen gas containing atmosphere for about 10 hours after annealing; then annealing said pressed and sintered mixture at about 450° C. for about 10 hours and diffusing component atoms to fill in voids to form a mass of density of 5.68–5.75 g/cc; and said sintering and said final annealing steps causing positioning of said $SnO_2$ particles in said mass to thereby cause strengthening of said mass by increasing fracture toughness at least about 90% compared to said $YBa_2Cu_3O_{7-x}$ without said $SnO_2$ additions.

* * * * *